United States Patent [19]
Holland

[11] Patent Number: 4,777,438
[45] Date of Patent: Oct. 11, 1988

[54] MULTIPLE IMAGING WITH IMPROVED SIGNAL-TO-NOISE RATIO

[75] Inventor: G. Neil Holland, Chagrin Falls, Ohio

[73] Assignee: Picker International, Inc., Highland Hts., Ohio

[21] Appl. No.: 42,894

[22] Filed: Apr. 27, 1987

[51] Int. Cl.$^4$ ............................................. G01R 33/20
[52] U.S. Cl. ..................................... 324/309; 324/318
[58] Field of Search ................ 324/300, 307, 309, 311, 324/312, 318, 319, 320, 322

[56] References Cited

U.S. PATENT DOCUMENTS

| | | | |
|---|---|---|---|
| 4,623,843 | 11/1986 | Macovski | 324/309 |
| 4,665,368 | 5/1987 | Sugiyama | 324/309 |
| 4,668,915 | 5/1987 | Daubin | 324/309 |
| 4,691,163 | 9/1987 | Blass et al. | 324/309 |

OTHER PUBLICATIONS

Nuclear Magnetic Resonance Imaging by Partain, et al., W. B. Saunders Company, 1983, pp. 128–151.
NMR in Medicine: The Instrumentation and Clinical Applications, edited by Thomas, et al., published for the American Assoc. of Physicists in Medicine, Medical Physics Monograph No. 14, pp. 166–179.
"Nuclear Magnetic Resonance NMR Imaging" edited by Partain et al., 1983, pp. 128–151.

Primary Examiner—Michael J. Tokar
Attorney, Agent, or Firm—Fay, Sharpe, Beall Fagan, Minnich & McKee

[57] ABSTRACT

Gradients are caused across a magnetic field in an image region by gradient field coils (22). A transmitter (30) causes an RF antenna (32) to generate excitation pulses to excite selected dipoles from the image region to resonance. A first receiving coil (50) and a second receiving coil (52) are disposed along the gradient to receive magnetic resonance signals from first and second fields of view (102, 104) within the image region. First and second phase sensitive detectors (70, 72) demodulate the magnetic resonance signals at different frequencies. Analog-to-digital converters (80, 82, 84, 86) digitize magnetic resonance signal components from the phase sensitive detectors to provide digital data for reconstruction by Fourier transform circuits (90, 92). By interconnecting each of the receiving coils with one of the phase sensitive detectors, two of the analog-to-digital converters, and one of the Fourier transform circuits, two images each corresponding to one of the fields of view can be generated concurrently. Alternately, a single receiving coil may provide a single magnetic resonance signal which is split among the phase sensitive detectors and the analog-to-digital converters. In this manner, parallel and processing channels are provided to reduce the noise by the square root of two.

20 Claims, 7 Drawing Sheets

MULTIPLE IMAGING WITH IMPROVED SIGNAL-TO-NOISE RATIO

BACKGROUND OF THE INVENTION

The present invention relates to the art of diagnostic imaging. It finds particular application in conjunction with magnetic resonance imaging and will be described with particular reference thereto. However, it is to be appreciated that the present invention may also find application in conjunction with CT scanners, nuclear cameras, and other electronic image reconstruction techniques.

Conventionally, magnetic resonance imagers have included a single receiving channel for receiving magnetic resonance signals for conversion into an image representation. Commonly, a single coil having a configuration particularly adapted to the region of the patient to be imaged is disposed within the bore of the magnetic resonance imager and interconnected with the receiver. In a quadrature detection system, the receiver includes a signal splitter which divides the magnetic resonance signal into sine and cosine components. The sine and cosine components are each demodulated to eliminate the carrier frequency and filtered to remove stray frequency components. One analog-to-digital converter digitizes the filtered sine component and a second converter digitizes the filter cosine component. A two dimensional Fourier transform computer subroutine transforms the digitized sine and cosine resonance signal data into phase maps or image representations.

One of the problems with the prior art magnetic resonance imagers resided in the relatively high noise of the receiver. Due to the range of experimental conditions such as pulse sequences, the small ratio of the peak of the zero phase encoded echo to its least discernable side lobe, and variable image parameters such as the field view and slice thickness, it is necessary for the receiver to handle a wide dynamic amplitude range of magnetic resonance signals. The receiver has to handle the largest anticipated signal without compression, yet also process the smallest anticipated signal.

In early magnetic resonance imagers, the lower signal-to-noise ratio of the magnetic resonance signal dominated the noise of the receiver and the analog-to-digital converters. However, due to higher field strengths and other improvements, the signal-to-noise ratio of the received magnetic resonance signal no longer necessarily dominates the noise of the receiver.

Using surface coils, imaging a plurality of body parts has heretofore required a corresponding plurality of scans. After each scan, the coil is moved adjacent a second body part and a second scan is conducted to generate the data for the image of the second body part. Alternately, the adjacent body parts could be imaged in one scan by increasing the size of the coil and the field of view. However, such an increase in the field of view increases the noise and lowers the resolution.

The present invention provides a new and improved magnetic resonance imaging technique and apparatus which overcomes the above referenced problems and others.

SUMMARY OF THE INVENTION

In accordance with one aspect of the present invention, a magnetic resonance imager is provided which includes a plurality of receivers. In one embodiment, two or more receivers including the respective analog-to-digital converters convert the sine component of the magnetic resonance signal and two or more digitize the cosine component. The digitized components may be summed and Fourier transformed to produce an image or may be Fourier transformed separately and the resultant images summed.

In accordance with another aspect of the present invention, a plurality of surface coils are provided, each connected to a different receiver. Preferably, the surface coils are disposed coplanar in a spaced relationship along the direction which the "read" gradient magnetic field is applied during imaging. By demodulating the magnetic resonance signal from each coil at a different frequency, the magnetic resonance data from the regions adjacent each coil can be maintained separate. Separate Fourier transform or other reconstruction operations are performed on the signals from each coil to process the data for two images concurrently.

One advantage of the present invention is that it reduces noise degradation in the resultant image representations.

Another advantage of the present invention resides in the concurrent imaging of two regions of the patient.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components or in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
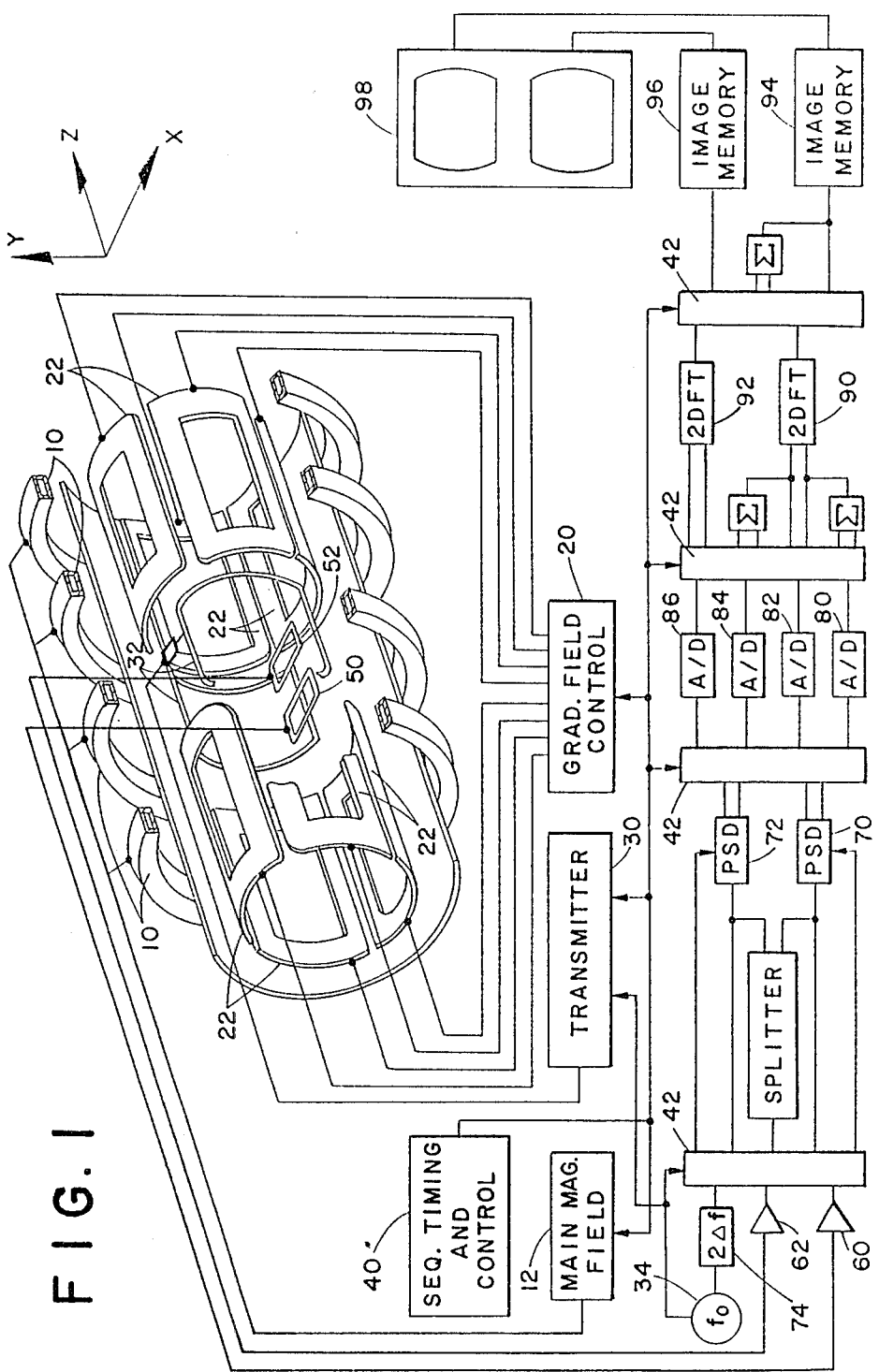
FIG. 1 is a diagrammatic illustration of a magnetic resonance imaging apparatus in accordance with the present invention.

With reference to FIG. 1, a magnetic resonance imaging apparatus includes a plurality of main magnetic field coils 10. A main magnetic field control means 12 controls the coils to cause the creation of a substantially uniform magnetic field longitudinally through an image region. A gradient field control means 20 causes a plurality of gradient coils 22 to generate magnetic field gradients across the image region. In particular, the gradient field control means causes slice select, read, and phase encode gradient pulses to be applied to the gradient coils to cause corresponding magnetic field gradients across the image region. A transmitter means 30 causes radio frequency transmission coils 32 to generate magnetic resonance excitation, inversion, and manipulation pulses in the image region. A carrier frequency oscillator 34 sets a carrier frequency for the transmitter. A sequence timing and control means 40 controls at least the gradient field control means 20 and the transmitter 30 such that the gradient pulse sequences and magnetic resonance excitation and manipulation pulses are applied with the appropriate timing. The timing and control means also control a plurality of switching means 42, 44, 46, and 48 for selectively interconnecting the below discussed components in different arrangements.

A pair of receiving coils 50, 52 are disposed in the image region to receive magnetic resonance signals from an examined patient or subject. Preferably, the receiving coils are surface coils which conform to preselected regions of the patient's anatomy. For example, one coil may conform to the patient's back adjacent the lumbar region of the spine and the other might conform to a region of the patient's back adjacent the thoracic region of the spine. Alternately, the receiving coils might be configured to conform to complementary body parts such as the kidneys, inner ear, knees, or the like. Preferably, the coils are coplanar to reduce or eliminate cross talk or interference between the received signals. Optionally, additional coils may be used.

A separate receiver is connected with each of the receiving coils. More specifically, a first preamplifier 60 is connected with the first receiving coil and a second preamplifier 62 is connected with the second receiving coil. A detector means includes a pair of phase sensitive detectors 70 and 72 that are selectively interconnectable with the preamplifiers by the switching means 42. A frequency shift means 74 provides an offset to the carrier frequency generated by the oscillator 34. The offset is selected in accordance with the strength of the magnetic field gradient that lies along the direction of the receiving coils. The carrier or central frequency of one of the coils is offset from the central or carrier frequency of the signals received by the other coil by the frequency offset. The switching means 42 selectively switches the carrier frequency from the generator 30 or the sum of the carrier frequency and the offset from the offset means 74 with the phase sensitive detectors 70, 72. The phase sensitive detectors each provide sine and cosine components of the received magnetic resonance signals. A plurality of analog-to-digital converters 80, 82, 84, and 86 are selectively interconnectable with the phase sensitive detectors or the switching means 42.

An image reconstruction means, such as a first two dimensional transform means 90 and a second two dimensional Fourier transform means 92, is selectively interconnected with the analog-to-digital converters by the switching means 42. First and second image memories 94, 96 selectively store the reconstructed image representation as received from the Fourier transform means through the switching means 42. A display means 98 converts the image representation into a man readable display.

Figure 2:
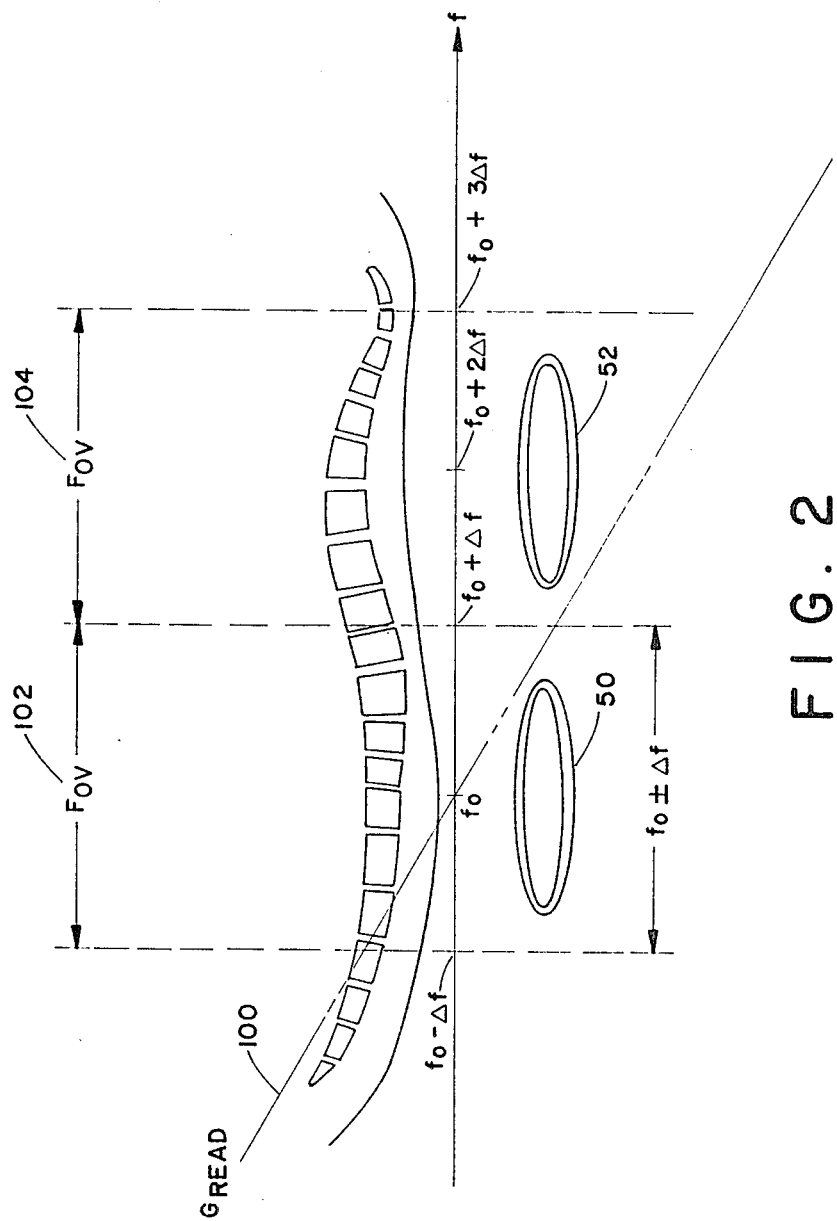
FIG. 2 illustrates dual receiver coil placement for concurrently imaging two regions of the spine.
Figure 3:
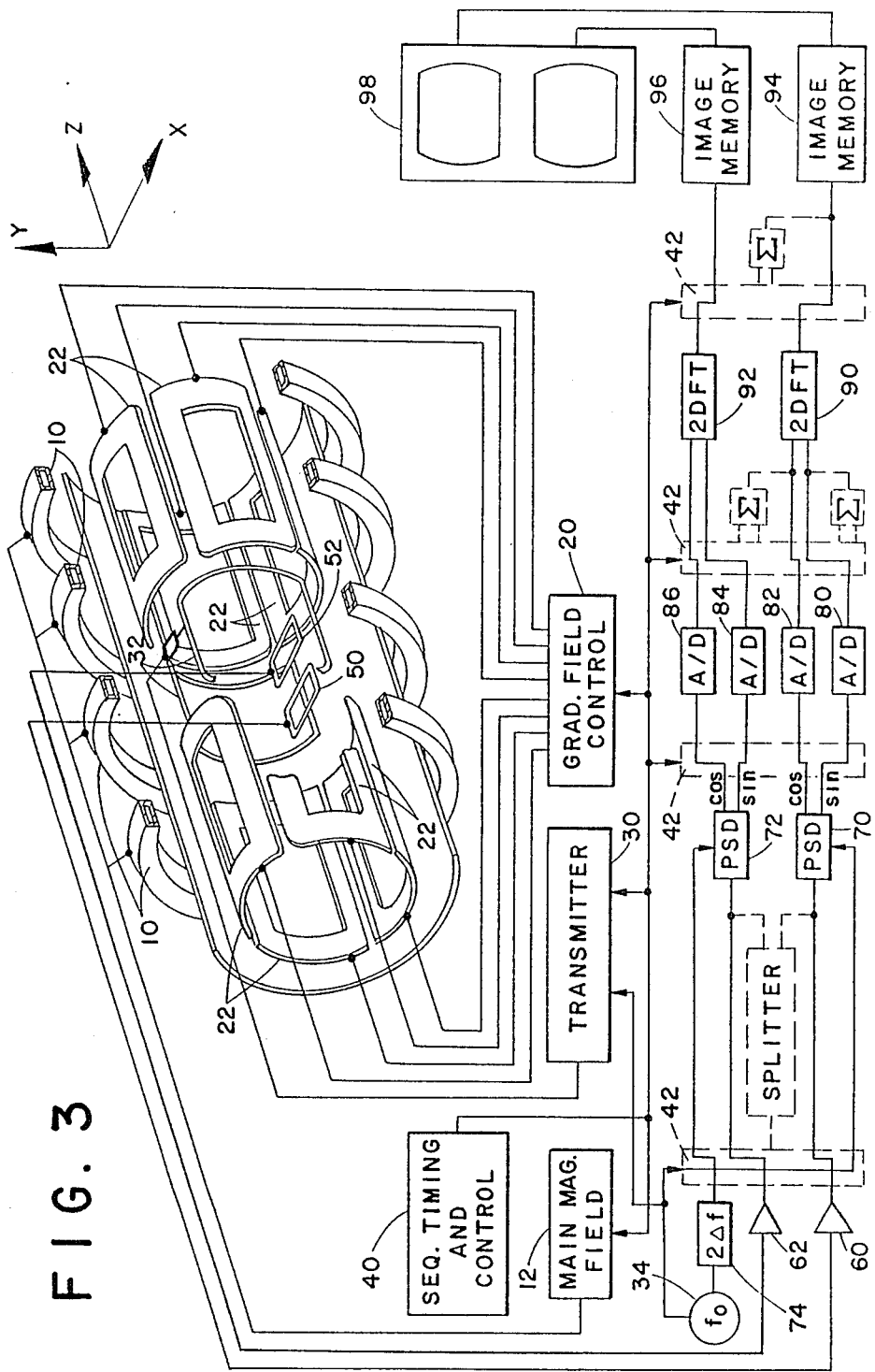
FIG. 3 illustrates those components of the apparatus of FIG. 1 as are utilized for concurrently deriving images from a plurality of surface coils.

With reference to FIGS. 2 and 3, the surface coils 50, 52 are disposed adjacent the thoracic and lumbar regions of a patient's spine or other selected body parts, which are disposed in the image region along a z-axis. A read gradient 100 is applied along the z direction to set up a first preselected field of view 102, e.g. a 15 centimeter field of view. If only the first coil 50 were present, the patient would be positioned along the z-axis such that the first coil 50 was centered in the first field of view. The resonance signals emanating from the first field of view region of the patient have a center frequency $f_o$ and a bandwidth $\pm \Delta f$. The first preamplifier 60 amplifies the resonance signals received by the first coil 50. The first phase sensitive detector 70 demodulates the resonance frequency about the center frequency $f_o$ and divides it into first and second components that have a preselected phase relationship, preferably sine and cosine components that have a 90° phase difference. The sine and cosine components are individually digitized by analog-to-digital converters 80, 82 to provide digital inputs for the first two dimensional Fourier transform means 90. The resultant image of the first field of view is stored in the first image memory 94 for display on the display means or the like.

The second coil 52 is centered in a second field of view 104 to receive magnetic resonance signals emanating from that region. The magnetic field gradient is selected such that the resonance signal from the second field of view has a center frequency $f_o + 2\Delta f$ and a bandwidth $\pm \Delta f$. The signal from the second coil 52 is amplified by the second preamplifier 62 and demodulated by the second phase sensitive detector 72. The second phase sensitive detector demodulates the resonance signals from the second coil at a frequency which differs from the center or demodulation frequency of the first phase sensitive detector by $2\Delta f$. The $2\Delta f$ bandwidth is selected such that the first and second fields of view do not overlap under the implemented imaging conditions. The $2\Delta f$ is equal to or greater than the average of the bandwidths spanned by the fields of view. It might be noted that if the second receiving coil were connected with the first phase sensitive detector without adjustments to the read gradient or other imaging conditions, then all received frequencies from the second field of view would be outside of the first field of view and would be filtered out by bandwidth limiting filters of the first phase sensitive detector. Analogously, if the first coil were connected with the second phase sensitive detector, the resonance signal components received from the first field of view would be filtered by the filters of the second phase sensitive detector.

The sine and cosine components from the second phase sensitive detector are digitized by analog-to-digital converters 84, 86. The second two dimensional Fourier transform means 92 transforms the digitized components into a second image representation that is stored in the second image memory 96.

In this manner, at the end of a single imaging sequence or scan, two complete sets of image data are collected with no loss in the signal-to-noise ratio or the resolution. Analogously, third or additional coils may be provided along with additional receivers, phase sensitive detectors, analog-to-ditigal converters, and image reconstruction means.

Figure 4:
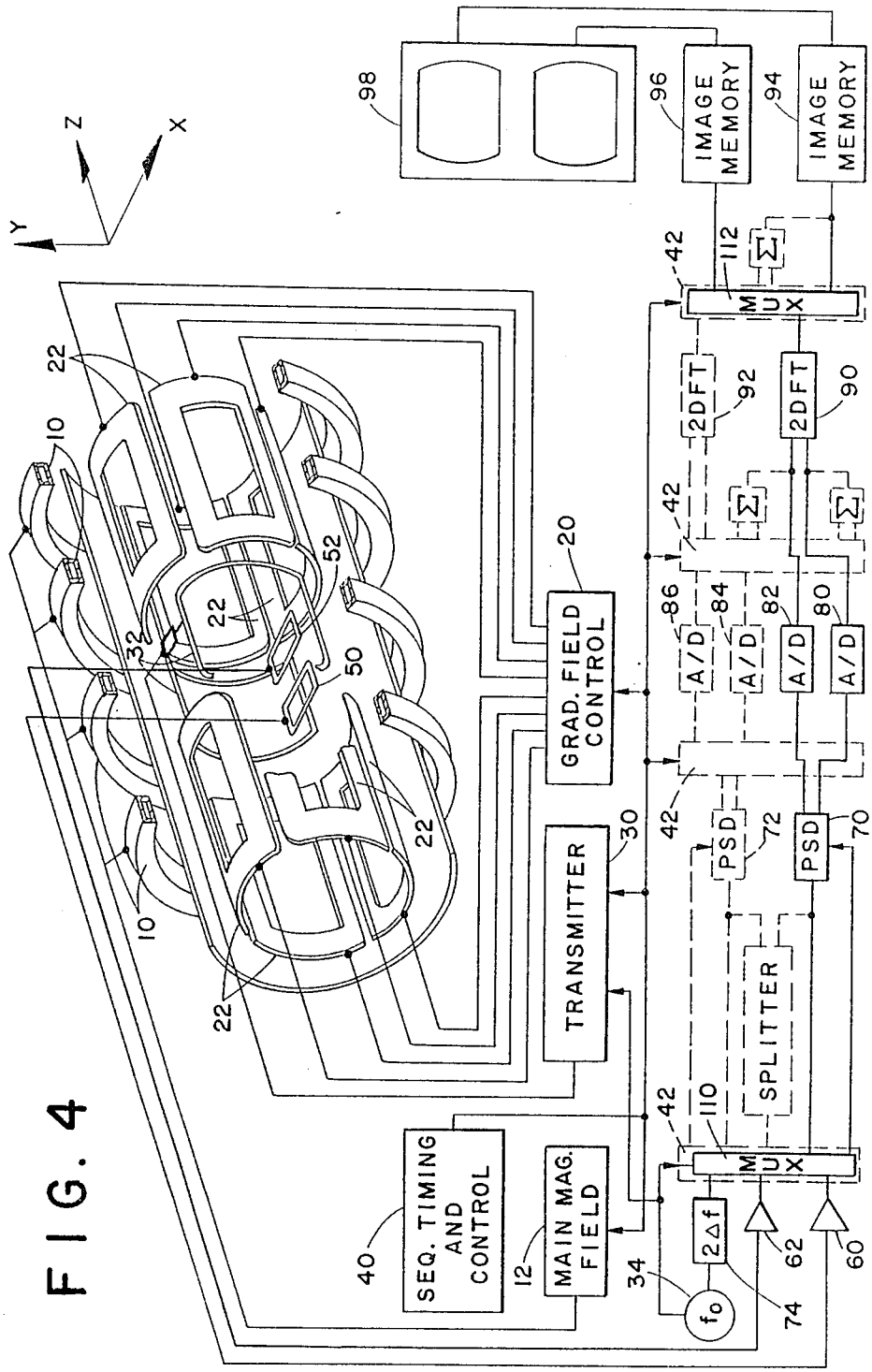
FIG. 4 is an alternate embodiment illustrating components for implementing a two coil, concurrent imaging technique.

With reference to FIG. 4, two separate images can be derived from the first and second coils by time sharing the operation of a single receiver. The switching means 42 includes a first multiplexing means 110 which alternately connects each coil to the first phase sensitive detector 70. The signal from one coil is sampled on the first echo and the signal from the other coil is sampled during the second echo. The multiplexer 110 alternately connects the demodulating frequencies from the oscillator 34 and the frequency shift means 74 with the phase sensitive detector. The components are digitized and Fourier transformed into image data. The switching means also includes a second multiplexing means 112 that alternately channels the image data from the two dimensional Fourier transform means 90 into the first and second image memories 94, 96. In alternate views, the multiplexing means 110 reverses the order which coil is sampled during the first echo and which is sampled during the second echo. In this manner, two complete sets of image data are collected concurrently without adversely affecting the signal to noise ratio or the resolution. However, the images have a mixture of contrast attributable to T1 and T2 echo times due to the difference in the T1 and T2 weighting of the first and second echoes.

It is to be appreciated that this imaging technique is not limited to imaging the spine. It is applicable to the imaging of other body parts, particularly where coplanar or otherwise non-interacting surface coils can be utilized. Where appropriate, the read gradient may be applied along the x-axis or the y-axis, i.e. transverse to the scans. It is further to be appreciated that the first and second phase sensitive detectors are not required to demodulate the received resonance signals on resonance. However, to avoid overlap of the images, the demodulation frequencies should be greater than the imaging bandwidth determined by the sampling time and the read gradient.

Figure 5:
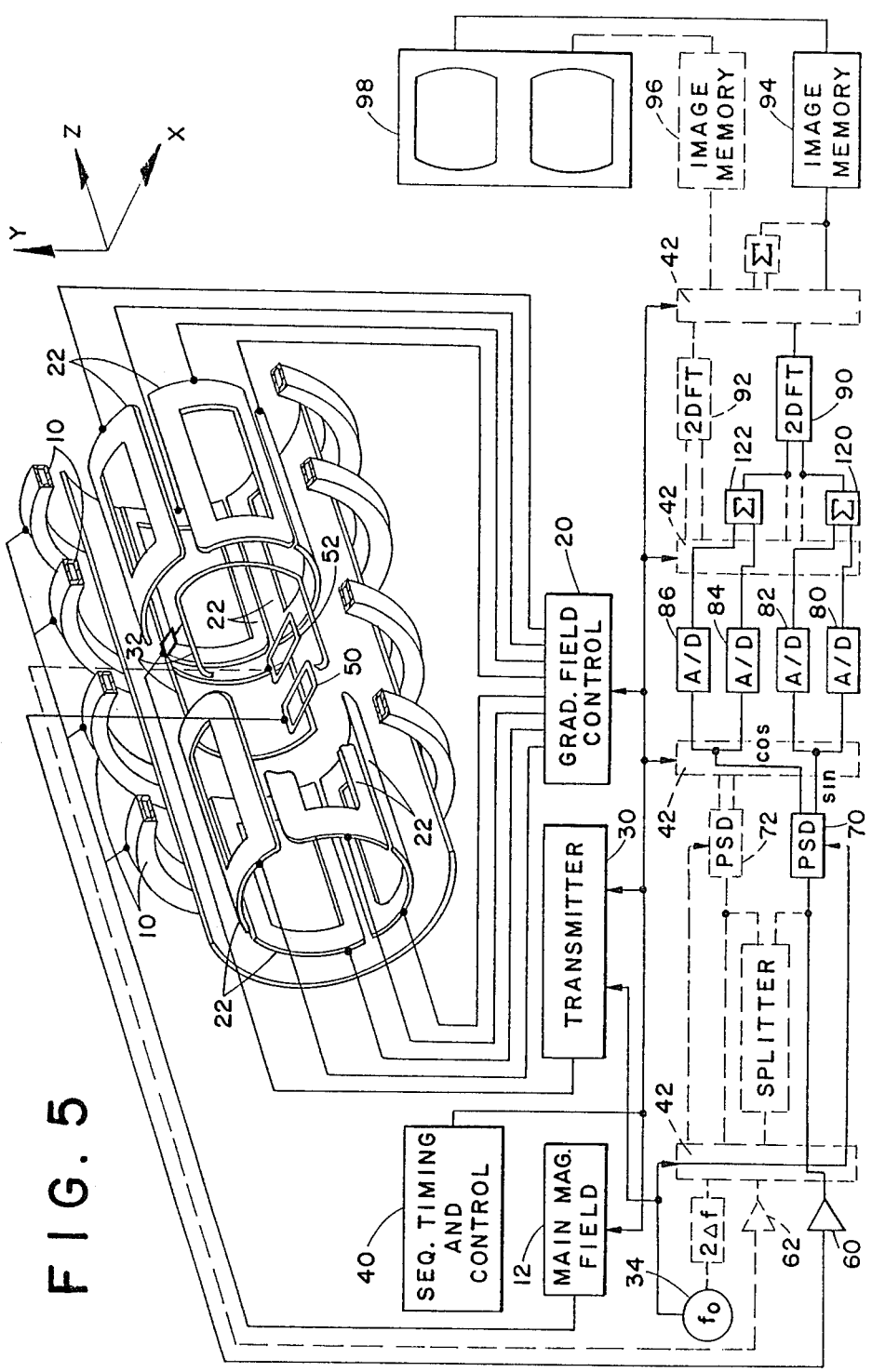
FIG. 5 is a diagrammatic illustration of those components of the apparatus of FIG. 1 which are utilized in a noise reducing aspect of the present invention.

With reference to FIG. 5, in some instances it has been found that the receiver and associated analog-to-ditigal converters are the dominant source of system noise. In the embodiment of FIG. 5, the noise is reduced by providing a plurality of analog-to-digital converters in parallel and summing their outputs to reduce the noise contribution. More specifically, the resonance signal is demodulated by the phase sensitive detector 70 and divided into sine and cosine components. Two or more analog-to-digital converters 80, 82 are connected in parallel to receive the sine component and two or more analog-to-digital converters 84, 86 are connected in parallel to receive the cosine component. A first summing means 120 sums the output of the analog-to-digital converters connected with the sine component and a second summing means combines the digital cosine components. In this manner, a noise attributable to the analog-to-digital converters is averaged and reduced by the square root of 2. The averaged signals are converted by a two dimensional Fourier transform means 90 to an image representation.

The parallel connected analog-to-digital converters may operate simultaneously. Alternately, one of the analog-to-digital converters in each parallel connected pair may be delayed relative to the other to eliminate correlations in the noise. The delay may be a small, fixed delay or may vary cyclically or randomly over a preselected range.

As another alternative, two reconstruction means such as two Fourier transform means may be provided. Each Fourier transform means receives one digitized sine input and one digitized cosine input. The summing means is provided at the output of the two Fourier transform means to sum the reconstructed image data to store the sum in the image memory 94.

Figure 6:
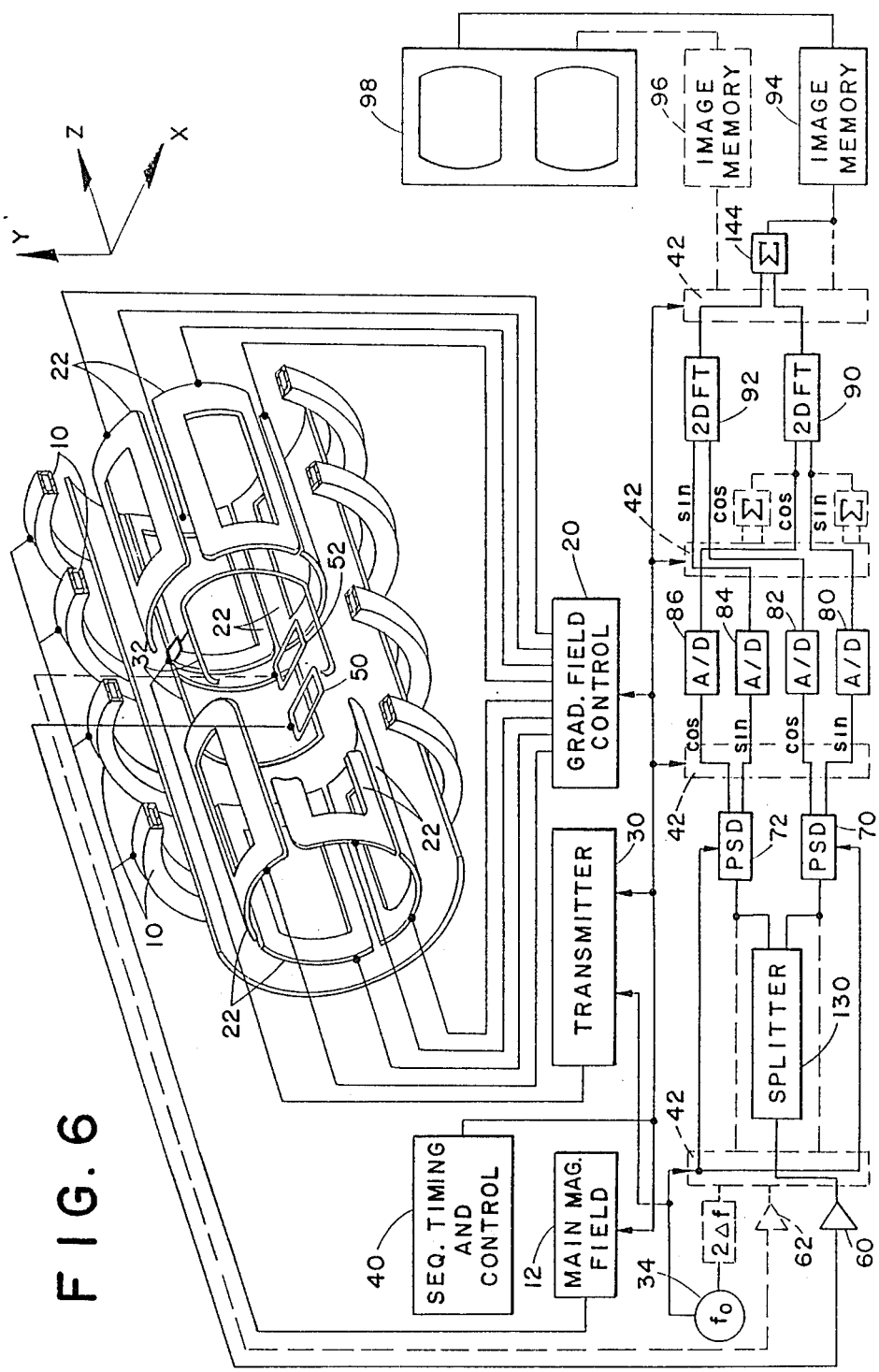
FIG. 6 is an alternate circuit configuration for reducing noise.
Figure 7:
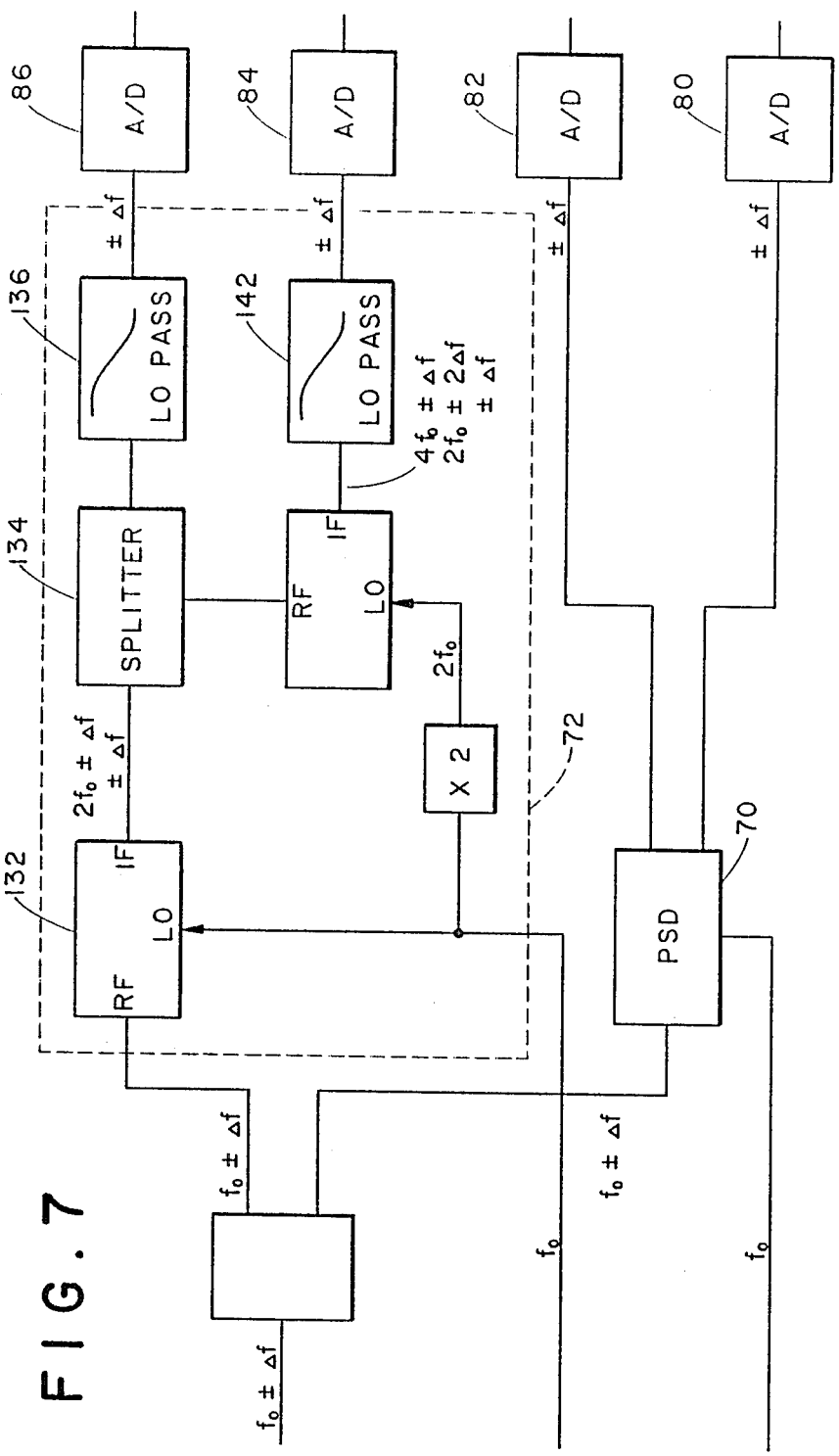
FIG. 7 illustrates a preferred phase sensitive detector circuit which is particularly adapted for the embodiment of FIG. 6.

With reference to FIGS. 6 and 7, the demodulation of the resonance signal produces upper and lower sidebands which are informationally redundant but which may have different noise characteristics. By retaining and combining the information from both sidebands, a reduction in the noise can be achieved. The signal from the receiving coil is amplified and conveyed to a signal splitter 130 which splits the signal between two channels 70 and 72. The phase sensitive detection means 72 is described in detail but it is to be appreciated that the description applies by analogy to the phase sensitive detector means 70 as well.

A first demodulating means 132 demodulates the received magnetic resonance signal which has a center frequency $f_0$ and a bandwidth $\pm \Delta f$. This produces two sidebands—an upper sideband $2f_0 + \Delta f$ and a lower sideband $\pm f$. A signal splitter 134 splits the upper and lower sidebands. A first low pass filter 136 removes the upper sideband and stray out of band signals from the low sideband. A second or upper sideband demodulating means 138 demodulates the upper sideband. More specifically, a frequency doubling means 140 doubles the demodulation frequency and the upper sideband demodulating means demodulates the upper sideband at the doubled demodulation frequency. The upper sideband demodulating means produces a second lower sideband $\pm \Delta f$ as well as upper sidebands. A second low pass filter 142 removes the upper sidebands and the out of band frequency components. The second phase sensitive detector means 70 provides a similar phase detection scheme to provide two outputs which are conveyed to the analog-to-digital converters.

The first and second two dimensional Fourier transform means 90 and 92 convert the digitized outputs into digital representations of the same view. A summing means 144 sums the reconstructed outputs of the two Fourier transform means to provide a composite or summed image representation for storage in the image memory 94. Alternately, the outputs of the analog-to-digital converters can be summed by the summing means 120 and 122 analogous to the scheme of FIG. 5 and the digital sums provided as the inputs of a single two dimensional Fourier transform means.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:
    a main magnetic field means for generating a main magnetic field across an image region;
    a gradient field means for selectively causing gradient magnetic fields across the image region;
    a transmitter means for selectively exciting magnetic resonance of dipoles in the image region;
    a first receiving coil and a second receiving coil disposed adjacent to the image region, such that the first receiving coil produces a first resonance signal and the second receiving coil produces a second resonance signal, the first resonance signal having a first center frequency and a first bandwidth centered therearound and the second magnetic resonance signal having a second center frequency and a second bandwidth centered therearound;
    a detector means for demodulating the first resonance signal at the first center frequency to produce first and second, first resonance signal components and for demodulating the second resonance signal at the second center frequency to produce first and second, second resonance signal components;

an analog-to-digital converter means for digitizing resonance signal components to produce digital data signals; and, an image reconstruction means for reconstructing at least one image representation from the digital data signals.

2. The apparatus as set forth in claim 1 wherein the image reconstruction means includes a first two dimensional Fourier transform means operatively connected with two of the analog-to-digital converters for converting the digital data therefrom into a first image representation and a second two dimensional Fourier transform means operatively connected with the other two analog-to-digital converters for converting the digital data therefrom to a second image representation, the first image representation corresponding to the first resonance signal and the second image representation corresponding to the second magnetic resonance signal.

3. The apparatus as set forth in claim 1 wherein the detector means includes a first phase sensitive detector for demodulating the first resonance signal at the first center frequency and a second phase sensitive detector means for demodulating the second resonance signal at the second center frequency.

4. The apparatus as set forth in claim 1 further including a multiplexing means for alternately connecting the first and second receiving coils with the detector means, whereby the first and second magnetic resonance signals are alternately channelled to the detector means for demodulation.

5. A magnetic resonance imaging apparatus comprising:

a main magnetic field means for generating a main magnetic field across an image region;

a gradient field means for selectively causing gradient magnetic fields across the image region;

a transmitter means for selectively exciting magnetic resonance of dipoles in the image region;

a receiving coil means for receiving a magnetic resonance signal from dipoles in the image region excited to magnetic resonance;

a detector means for demodulating the received resonance signal and producing first and second components which have a preselected phase relationship;

a first pair of analog-to-digital converters connected in parallel with each other and connected with the detector means such that both digitize the first component;

a second pair of analog-to-digital converters connected in parallel with each other and connected with the detector means such that both digitize the second component; and, an image reconstruction means for reconstructing at least one image representation from the digitized components.

6. The apparatus as set forth in claim 5 wherein the receiving coil means includes a first receiving coil and a second receiving coil disposed adjacent to the image region, such that the first receiving coil produces a first resonance signal and the second receiving coil produces a second resonance signal.

7. The apparatus as set forth in claim 6 wherein the first and second receiving coils are substantially coplanar.

8. The apparatus as set forth in claim 5 further including:

a first summing means for summing digital data from the first two parallel connected analog-to-digital converters; and, a second summing means for summing digital data from the second pair of parallel connected analog-to-digital converters, the reconstruction means being operatively connected with the first and second summing means to receive the summed digital data therefrom for reconstruction into the image representation.

9. The apparatus as set forth in claim 5 wherein the reconstruction means includes a first two dimensional Fourier transform means for transforming the digital data from two of the analog-to-digital converters and a second two dimensional Fourier transform means for transforming the digital data from the other two analog-to-digital converters and further including a summing means for summing the Fourier transformed digital data from the first and second two Fourier transform means to produce the image representation.

10. The apparatus as set forth in claim 5 further including timing and control means for controlling the operation of the analog-to-digital converters such that the four analog-to-digital converters function non-simultaneously, whereby time coherent noise is reduced.

11. A magnetic resonance imaging apparatus comprising:

a main magnetic field means for generating a main magnetic field across an image region;

a gradient field means for selectively causing gradient magnetic fields across the image region;

a transmitter means for selectively exciting magnetic resonance of dipoles in the image region;

a receiving coil means for receiving magnetic resonance signal from dipoles in the image region excited to magnetic resonance;

a signal splitter means operatively connected with the receiving means for splitting the magnetic resonance signal;

a first demodulator means operatively connected with the splitter means for demodulating the magnetic resonance signal received from the splitting means and producing first and second resonance signal components with a preselected phase difference, the first demodulating means being operatively connected with a first two analog-to-digital converters such that the first two analog-to-digital converters digitize the first and second magnetic resonance signal components;

a second demodulating means operatively connected with the spitter means for demodulating the magnetic resonance signal received from the splitting means and producing third and fourth resonance signal components with a preselected phase difference, the second demodulating means being operatively connected with a second two analog-to-digital converters such that the second two analog-to-digital converters digitize the third and fourth components; and, an image reconstruction means for reconstructing at least one image representation from the digitized components.

12. The apparatus as set forth in claim 11 wherein the first demodulating means includes:

a first phase sensitive detector which separates an upper and a lower sideband from the magnetic resonance signal;

a splitting means for splitting the upper and lower sidebands;

a first low pass filter for filtering the lower sideband to remove out of band components, the first low pass filter being operatively connected with the splitting means and one of the analog-to-digital converters;

a second phase sensitive detector for demodulating the upper sideband;

a second low pass filter for filtering out of band components, the second low pass filter being operatively connected with the second phase sensitive detector and one of the analog-to-digital converters.

13. A magnetic resonance imaging apparatus comprising:

a means for generating a main magnetic field across an image region;

a means for selectively causing gradient magnetic fields across the image region;

a means for selectively exciting magnetic resonance of dipoles in the image region;

a first receiving coil disposed adjacent the imaging region for receiving a first magnetic resonance signal from resonating nuclei in the image region;

a second receiving coil disposed adjacent the imaging region for receiving a second magnetic resonance signal from resonating nuclei in the image region;

a multiplexing means for alternately interconnecting the first and second receiving coils with a phase sensitive detector which demodulates the first and second resonance signals at first and second demodulation frequencies, respectively;

analog-to-digital converter means operatively connected with the phase sensitive detection means for digitizing the demodulated magnetic resonance signals; and, a transform means for transforming the digitized magnetic resonance signals into first and second image representations.

14. A magnetic resonance imaging apparatus including:

a first receiver means and a second receiver means for receiving and demodulating magnetic resonance signals from a common subject, the first receiver means demodulating the received magnetic resonance signals at a first frequency to produce first demodulated signals and the second receiver means demodulating the received magnetic resonance signals at a second frequency to produce second demodulated signals, the first frequency being different from the second frequency; and, image reconstruction means for reconstructing a first image representation from the first demodulated signals and a second image representation from the second demodulated signals.

15. A magnetic resonance imaging apparatus including:

first and second receiver means for receiving and demodulating magnetic resonance signals, the first receiver means demodulating the received magnetic resonance signals at the first frequency to produce real and imaginary first demodulated signal components and the second receiver means demodulating the received magnetic resonance signals at the first frequency to produce real and imaginary second demodulated signal components; and, image reconstruction means for reconstructing a single image representation from the first and second demodulated signal components, the image reconstruction means including:

an analog-to-digital converter means for separately digitizing the first and second, real and imaginary demodulated signal components;

a transform means for separately transforming the digitized signal components;

a combining means for combining the transformed first and second signal components into the single image representation, whereby the receiver noise degradation of the image is reduced.

16. A method of magnetic resonance imaging comprising:

receiving a magnetic resonance signal from a receiving coil means;

demodulating the received magnetic resonance signal and producing first and second signal components with a preselected phase difference;

digitizing the first signal component a first time to produce a first digital data signal;

digitizing the first signal component a second time to produce a second digitized data signal;

digitizing the second signal component a first time to produce a third digital data signal;

digitizing the second signal component a second time to produce a fourth digital data signal; and, reconstructing an image representation from the first, second, third, and fourth digital data signals.

17. The method as set forth in claim 16 further including summing the first and second digital data signal and summing the third and fourth digital data signals such that the reconstructing step is performed on the summed digital data signals.

18. The method as set forth in claim 16 wherein the reconstructing step includes reconstructing a first image representation from two of the first, second, third, and fourth digital data signals and reconstructing a second image representation from the other two of the first, second, third, and fourth digital data signals.

19. A method of concurrently imaging first and second contiguous regions of a single subject, the method comprising:

generating a main magnetic field through the first and second regions;

causing a gradient magnetic field across the first and second regions along at least a first axis such that a first field of view centered on a first frequency is defined along the first region and a second field of view centered on a second frequency is defined along the second region;

exciting magnetic resonance of dipoles disposed within the first and second fields of view;

receiving a first magnetic resonance signal from dipoles resonating within the first field of view;

receiving a second magnetic resonance signal from dipoles resonating within the second field of view; and, reconstructing first and second image representations of the first and second regions, respectively, from the first and second magnetic resonance signals.

20. The method as set forth in claim 19 further including demodulating the first magnetic resonance signal at the first frequency and demodulating the second magnetic resonance signal at the second frequency.

* * * * *